United States Patent [19]

Zaitsu

[11] Patent Number: 5,329,200
[45] Date of Patent: Jul. 12, 1994

[54] PIEZOELECTRIC TRANSFORMER CONVERTER FOR POWER USE

[75] Inventor: Toshiyuki Zaitsu, Tokyo, Japan

[73] Assignee: Nec Corporation, Tokyo, Japan

[21] Appl. No.: 93,009

[22] Filed: Jul. 19, 1993

[30] Foreign Application Priority Data

Jul. 17, 1992 [JP] Japan ............................ 4-190557
May 14, 1993 [JP] Japan ............................ 5-112772

[51] Int. Cl.$^5$ ..................................... H01L 41/08
[52] U.S. Cl. .............................. 310/316; 310/318; 310/359; 310/366
[58] Field of Search ............... 310/314, 316, 317, 318, 310/319, 358, 359, 366

[56] References Cited

U.S. PATENT DOCUMENTS

| | | | |
|---|---|---|---|
| 3,636,386 | 1/1972 | Kawada | 310/319 |
| 3,679,918 | 7/1972 | Keizi | 310/316 |
| 3,683,210 | 8/1972 | Kawada | 310/318 |
| 3,743,868 | 7/1973 | Kawada | 310/318 |
| 3,778,648 | 12/1973 | Kawada | 310/318 |
| 4,459,505 | 7/1984 | Lim | 310/318 |

FOREIGN PATENT DOCUMENTS

| | | |
|---|---|---|
| 61-54686 | 3/1986 | Japan . |
| 449846 | 2/1992 | Japan . |
| 454492 | 5/1992 | Japan . |
| 4133657 | 5/1992 | Japan . |

OTHER PUBLICATIONS

Japanese Patent Abstract No. 61-54686.
Japanese Patent Abstract No. 4-49846.
Japanese Patent Abstract No. 4-133657.

*Primary Examiner*—Mark O. Budd
*Attorney, Agent, or Firm*—Sughrue, Mion, Zinn, Macpeak & Seas

[57] ABSTRACT

In a piezoelectric transformer converter for power use that includes a switching circuit that generates alternating current, a power-use piezoelectric transformer, and a rectification-smoothing circuit, the alternating current output of the power-use piezoelectric transformer is directly phase-inverted and amplified by a phase inversion-amplification circuit, and by way of a driving circuit, produces self-excited oscillation. In addition, the output voltage of the rectification-smoothing circuit is compared with a reference voltage by means of an error amplifier, and based on the resulting amplified voltage difference, the output voltage is controlled by using PWM control or frequency modulation control without the need for an additional electrode for self-excited oscillation. In addition, when controlling the output voltage to be constant, stable control is enabled that is unaffected by variance in the frequency characteristics of the power-use piezoelectric transformer.

3 Claims, 6 Drawing Sheets

$f_O$ : RESONANT FREQUENCY OF POWER-USE PIEZOELECTRIC TRANSFORMER.

$f_{SW}$ : FREQUENCY AT PHASE 0°.

A POINT : BEFORE FREQUENCY MODULATION.

B POINT : AFTER FREQUENCY MODULATION.

PIEZOELECTRIC TRANSFORMER CONVERTER FOR POWER USE

BACKGROUND OF THE INVENTION

1. Field of the Invention

The present invention relates to a piezoelectric transformer converter, and particularly to a switching power supply for low-voltage high-current electric power.

2. Description of the Prior Art

Various piezoelectric transformer converters have been proposed, of which several examples follow. U.S. Pat. No. 3,790,826, for example, discloses a piezoelectric transformer converter using longitudinal vibration mode, and Japanese Patent Laid-open No. 54686/86 discloses a self-excited piezoelectric transformer converter. Both of these disclosed piezoelectric transformer converters are for generating high voltage, and the use for which they are intended is therefore entirely different from that of the present invention. In addition, the latter piezoelectric transformer converter is provided with an additional electrode for self-excited oscillation.

U.S. Pat. No. 5,118,982 further discloses a piezoelectric transformer for power use using thickness-extensional vibration mode, but this U.S. patent discloses only a piezoelectric transformer and makes no mention of any peripheral circuits such as a switching circuit, a rectification-smoothing circuit, an oscillation circuit, or an output control circuit.

The present inventor has proposed in Japanese Utility Model Laid-open No. 54492/92 an invention in which a piezoelectric transformer using thickness-extensional vibration mode is supplemented with a switching circuit and a rectification-smoothing circuit, but in this case, no mention is made of self-excited oscillation or output control.

In Japanese Patent Laid-open No. 49846/92 and Japanese Patent Laid-open No. 133657/92, the present inventor has proposed a piezoelectric transformer converter that uses frequency characteristics to effect output-voltage control over piezoelectric transformer gain by separately excited oscillation, but these cases do not involve the self-excited oscillation system.

Although the present inventor has also proposed a piezoelectric transformer converter that uses self-excited oscillation in Japanese Patent Application No. 55020/92, this proposed piezoelectric transformer converter uses an additional electrode on the surface of the thickness-extensional vibration mode piezoelectric transformer. Moreover, this proposed invention is silent regarding output control.

As stated above, in a system for controlling switching frequency by separately excited oscillation (Japanese Patent Laid-open No. 49846/92 and Japanese Patent Laid-open No. 133657/92), the gain frequency characteristic of the piezoelectric transformer has an extremely high Q, and in addition, because this frequency characteristic varies greatly depending on the manufacturing process and temperature, actual setting of the frequency is difficult. Accordingly, self-excited oscillation is desirable, but when employing an additional electrode as in conventional cases, manufacture is complex.

SUMMARY OF THE INVENTION

The object of the present invention is to provide a piezoelectric transformer converter for power use that can effect self-excited oscillation without need of an additional electrode.

Another object of the present invention is to provide a piezoelectric transformer converter for power use that can control output voltage to be constant.

The piezoelectric transformer converter for power use of the present invention comprises switching means for generating an alternating current signal by switching an inputted direct current voltage; a power-use piezoelectric transformer that generates and transmits a piezoelectric vibration in accordance with the alternating current signal and then converts and outputs the voltage of the alternating current signal; rectification-smoothing means that rectifies and smooths the alternating current output of the power use piezoelectric transformer; phase inversion-amplification means for inverting the phase and amplifying the alternating current output of the power-use piezoelectric transformer; and driving means for generating a pulse signal to drive the switching means in accordance with the output signal of the phase inversion-amplification means.

According to a first embodiment of the present invention, the piezoelectric transformer converter for power use includes error amplification means for detecting the output voltage of the rectification-smoothing means and amplifying the voltage difference as compared with a reference voltage and pulse width-modulation means for changing the duty-cycle of the aforesaid pulse signal outputted by the driving means in accordance with the output voltage of the error amplification means and controls the alternating current output voltage of the aforesaid switching means in accordance with the difference in voltage and, as a result, holds the direct current output voltage of the rectification-smoothing means to be constant.

According to another embodiment of the present invention, the piezoelectric transformer converter for power use includes error amplification means for detecting the output voltage of the rectification-smoothing means and amplifying the difference in voltage as compared with a reference voltage and frequency modulation means for changing the frequency at the time of self-excited oscillations according to the output voltage of the error amplification means and controls the output frequency of the switching means by inputting the alternating current output of the frequency modulation means into the phase inversion-amplification means and, as a result, holds the direct current output voltage of the rectification-smoothing means to be constant.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

An explanation of the embodiments of the present invention will be given below with reference to the drawings.

Figure 1:
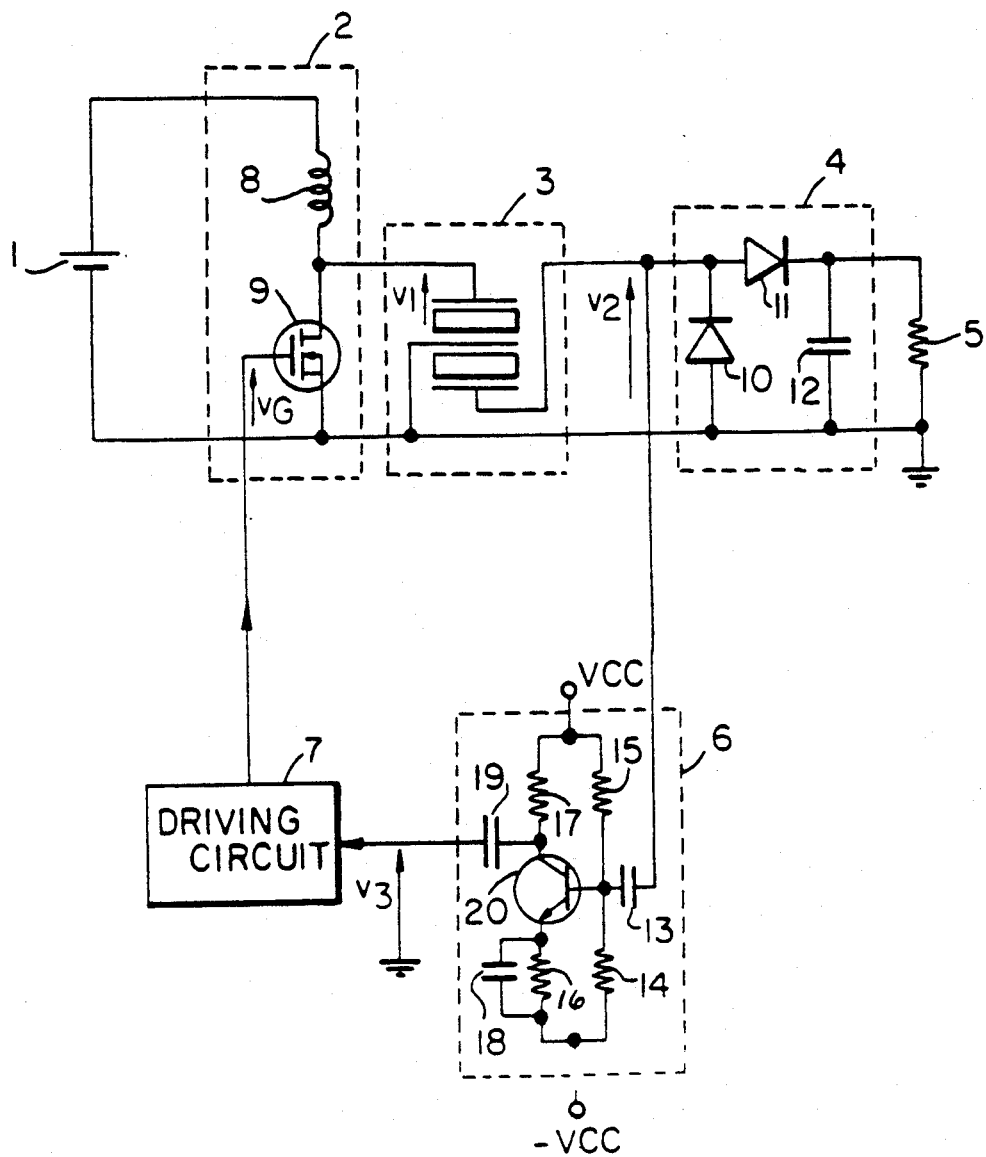
FIG. 1 is a circuit diagram illustrating the piezoelectric transformer converter for power use according to a first example of the present invention.

Referring to FIG. 1, the piezoelectric transformer converter for power use according to the first example of the present invention comprises an input power source 1, a switching circuit 2, a power-use piezoelectric transformer 3, a rectification-smoothing circuit 4, a phase inversion-amplification circuit 6, and a driving circuit 7. The switching circuit 2 is composed of a coil 8 and a transistor 9. The rectification-smoothing circuit 4 is composed of two diodes 10, 11 and a capacitor 12. The phase inversion-amplification circuit 6 is a known apparatus composed of a condenser 13, resistors 14, 15, 16, 17, condensers 18, 19, and a transistor 20. The driving circuit 7 can be constructed using a known comparator to compare the sine wave alternating current output of phase inversion-amplification circuit 6 with a fixed reference voltage and generate a pulse when the alternating current output exceeds the reference voltage.

Explanation will next be given of the operation of the piezoelectric transformer converter for power use shown in FIG. 1. By switching on and off the direct current voltage of the input power source 1 at the switching circuit 2, an alternating current voltage is generated. As for the wave form of the alternating current voltage, when the input capacity of the power use piezoelectric transformer is large, the switching loss for a sine wave or resonance wave will be less than that of a rectangular wave.

Figure 2:
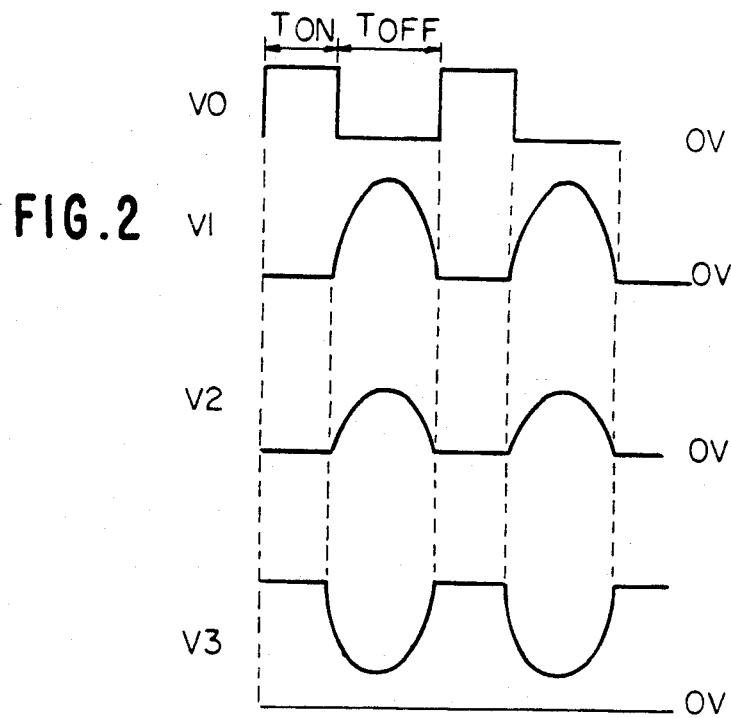
FIG. 2 is a wave form chart showing, in the piezoelectric transformer converter for power use shown in FIG. 1, the wave form of the gate voltage $v_G$ supplied to the gate of the transistor of the switching circuit, the wave forms of the input voltage $v_1$ and the output voltage $v_2$ of the piezoelectric transformer, and the wave form of the output voltage of the phase inversion-amplification circuit.

FIG. 2 shows the wave forms of the input voltage $v_1$ and the output voltage $v_2$ of the piezoelectric transformer 3, and the wave form of the output voltage $v_3$ of the phase inversion-amplification circuit 6 when a rectangular-wave gate voltage $V_G$ is supplied to the gate of transistor 9 of the switching circuit 2. By adjusting as appropriate the inductance value of the coil 8, the switching circuit 2 can achieve a resonance wave form as shown in FIG. 2. Rectangular form wave switching will be described below.

This alternating current voltage is inputted into the power-use piezoelectric transformer 3, its voltage is converted by the power-use piezoelectric transformer 3, made into direct current voltage by rectification-smoothing circuit 4, and electrical power is supplied to the load 5.

Figure 3A:
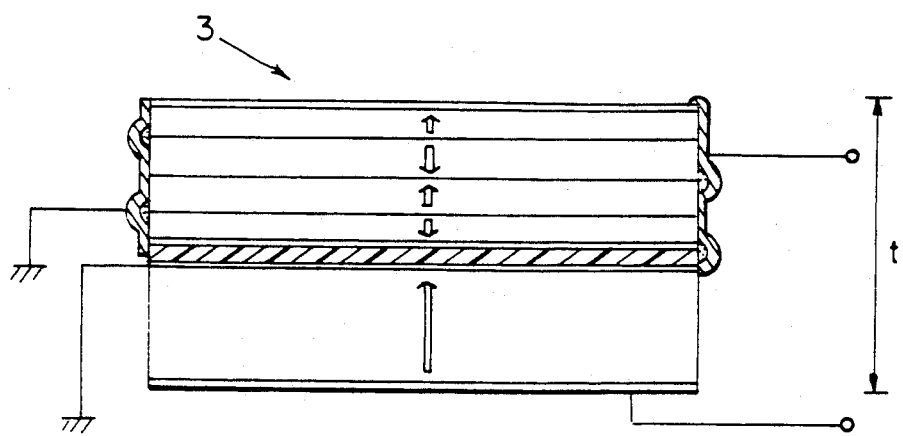
FIG. 3 illustrates a piezoelectric transformer for power use using thickness-extensional vibration mode, (a) being a section view and (b) being a perspective view.
Figure 3B:
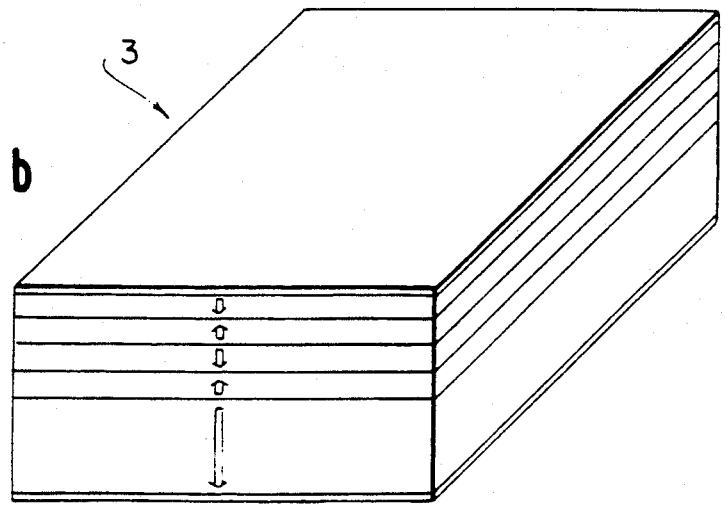

Explanation will next be given regarding the power-use piezoelectric transformer with reference to FIG. 3. In the present invention, a thickness-extensional vibration mode power-use piezoelectric transformer is used as power-use piezoelectric transformer 3. This type of thickness-extensional vibration mode power-use piezoelectric transformer 3 is disclosed in, for example, previously mentioned U.S. Pat. No. 5,118,982. In the thickness-extensional vibration mode power-use piezoelectric transformer 3, the secondary mode resonance frequency $f_{r2}$ is approximately equal to $(C_t/t)$ when the thickness is t and the sound wave speed in the direction of thickness is $C_t$. In other words, the secondary mode resonance frequency $f_{r2}$ is inversely proportional to the thickness t of the power-use piezoelectric transformer 3. For this reason, if the power-use piezoelectric transformer 3 is made thin, i.e., if the thickness t is made small, because the secondary mode resonance frequency $f_{r2}$ becomes large, the output power of per unit volume will increase due to the easy flow of current in the piezoelectric transformer 3. For example, if the sound wave speed Ct in the direction of thickness is approximately 4000 m/sec and the thickness t is 2 mm, the secondary mode resonance frequency $f_{r2}$ will be 2 MHz and an output of approximately 8 W over an area of 15 mm × 15 mm is possible. In this way, the needs for both a thinner body and a higher frequency are simultaneously satisfied.

Explanation will next be presented regarding a self-excited oscillation circuit. The alternating current output voltage of the power-use piezoelectric transformer 3 is directly inputted into phase inversion-amplification circuit 6 and that alternating current output is inputted into the driving circuit 7. In this way, if the voltage gain is 1 or more at the frequency $f_{sw}$ at which the phase of the power-use piezoelectric transformer 3 is "0," self-excited oscillation will occur at that frequency. The voltage gain at this time will be in the vicinity of a peak. Because the thickness-extensional vibration mode power-use piezoelectric transformer 3 operates at a high frequency of several MHz (in this case, 2 MHz), the phase inversion-amplification circuit 6 and the driving circuit 7 must also accommodate several MHz. Conventional piezoelectric transformers for generating high voltage are of a switching frequency of several tens of kHz and are therefore not within the frequency range of the power-use piezoelectric transformer 3 of the present invention.

Figure 4:
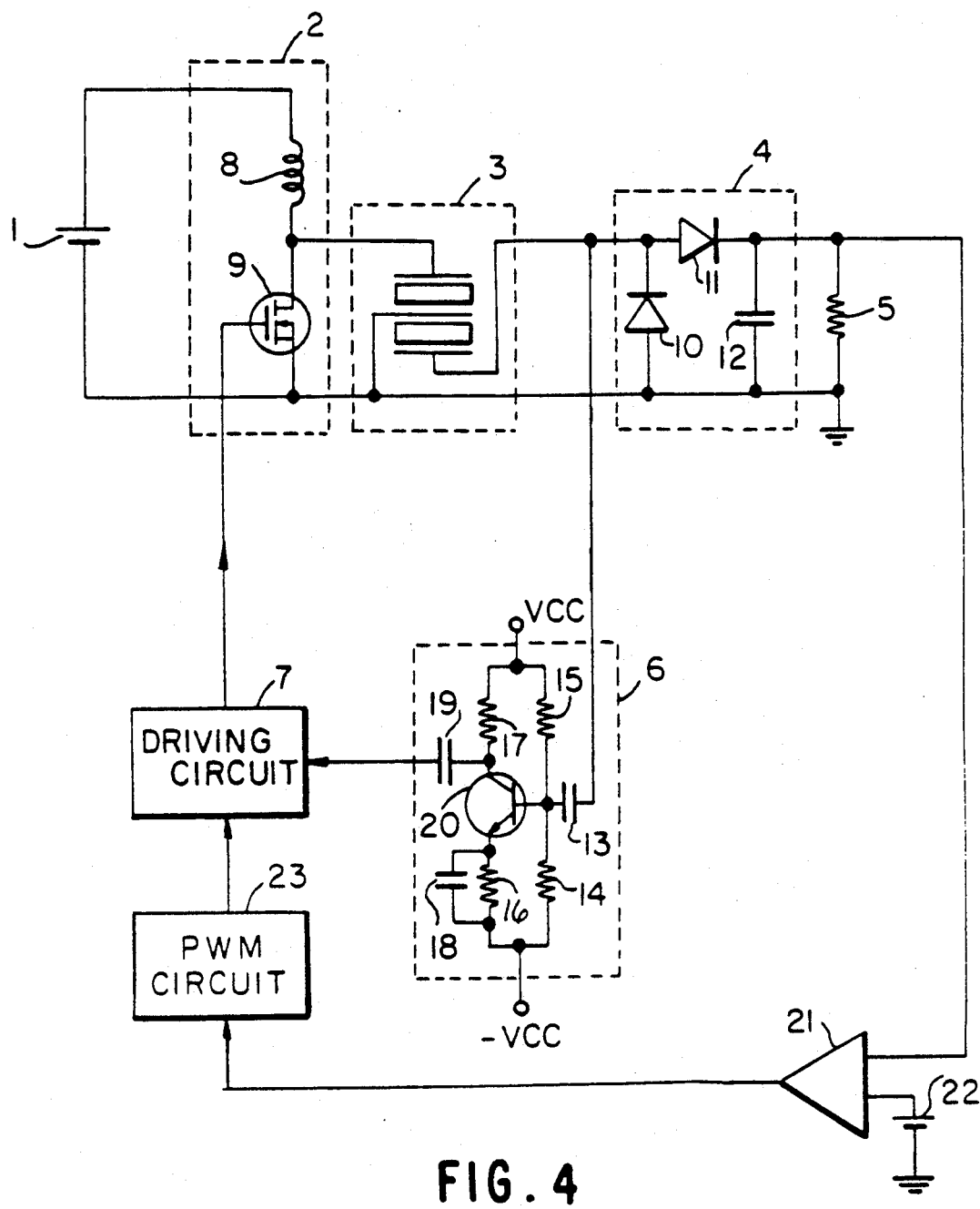
FIG. 4 is a circuit diagram showing a piezoelectric transformer converter for power use according to a second example of the present invention.

FIG. 4 shows a piezoelectric transformer converter for power use according to a second example of the present invention. The indicated piezoelectric transformer converter for power use is a circuit employing a pulse width modulation (PWM) control system, and other than the inclusion of an error amplifier 21, a reference voltage 22, and a PWM circuit 23, has a construction similar to that shown in FIG. 1. The difference between the output voltage of the rectification-smoothing circuit 4 and the reference voltage 22 is amplified by the error amplifier 21, and with this error-amplified voltage, the PWM circuit 23 changes the pulse width of the driving circuit 7. In this way, by changing the pulse width of the switching circuit 2 (On Time $T_{on}$ in FIG. 2), the output voltage is controlled. Here, the role of the PWM circuit 23 is to change the duty cycle of the output wave form of the driving circuit 7, and, for example, can be of a construction employing a transistor that is turned "on" in accordance with the output of error amplifier 21. The emitter of this transistor is grounded, and the collector is connected to the reference voltage input terminal of the comparator of driving circuit 7 or to another input terminal, and when the transistor is "on," by changing these terminal voltages, the duty cycle of the output wave form of driving circuit 7 is changed in accordance with the output of the error amplifier 21.

Figure 5:
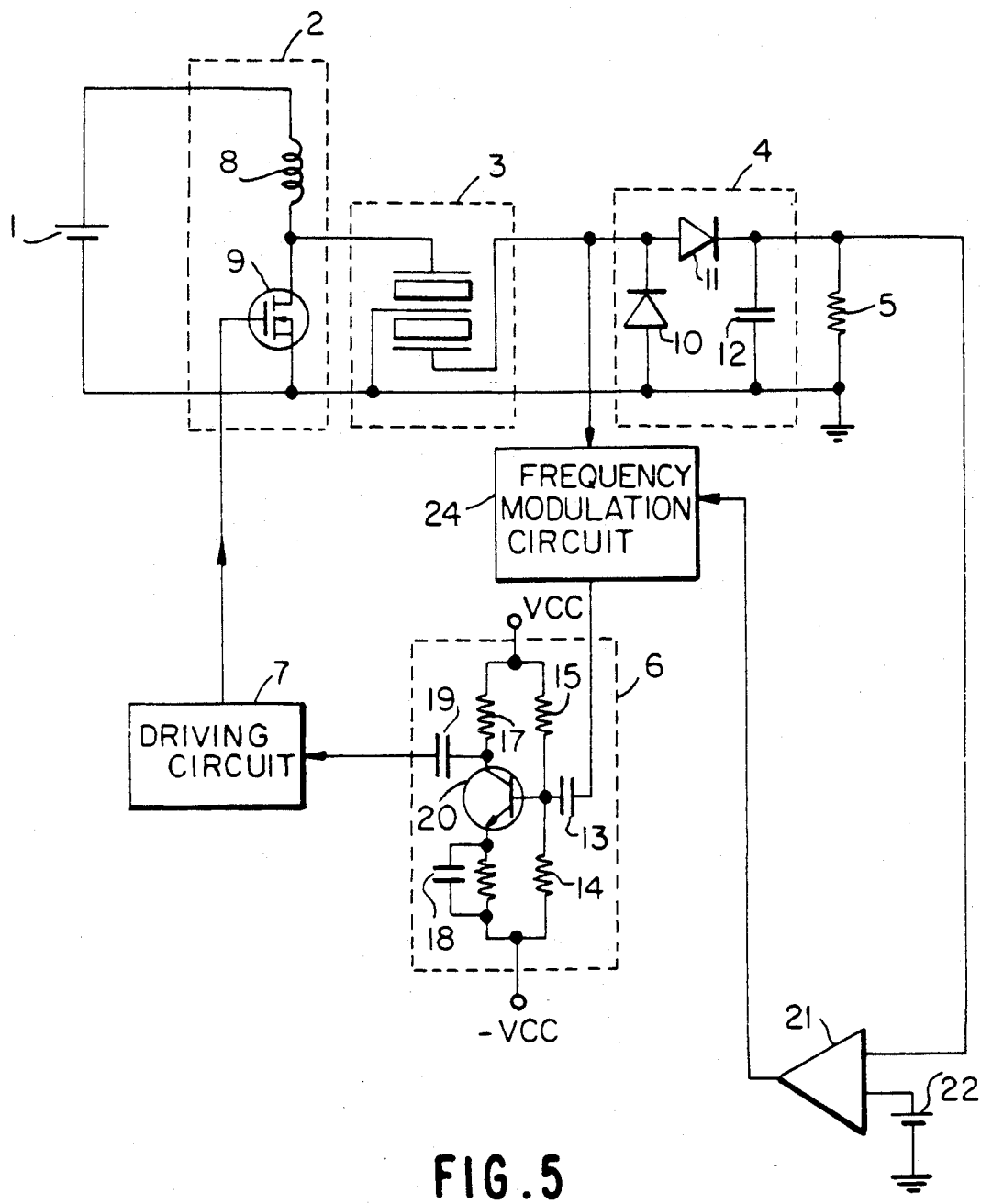
FIG. 5 is a circuit diagram showing a piezoelectric transformer converter for power use according to a third example of the present invention.

FIG. 5 shows a piezoelectric transformer converter for power use according to a third example of the present invention. The indicated piezoelectric transformer converter for power use is a circuit employing a frequency modulation control system, and, other than the inclusion of an error amplifier 21, a reference voltage 22, and a frequency modulation circuit 24, has a construction similar to that shown in FIG. 1. The difference between the output voltage of the rectification-smoothing circuit 4 and the reference voltage 22 is amplified by the error amplifier 21, and with this error-amplified voltage, the frequency modulation circuit 24 changes the frequency of the self-excited oscillation as explained below.

Figure 6:
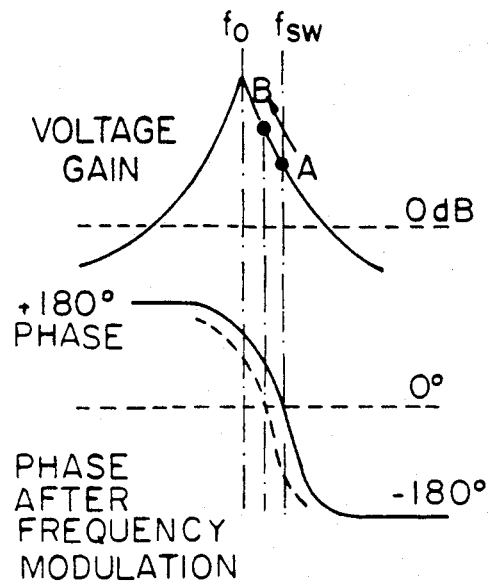
FIG. 6 shows the frequency characteristics of the voltage gain and phase of the open loop of a piezoelectric transformer converter according to the example of FIG. 5.

FIG. 6 shows the frequency characteristics of the voltage gain and phase of the open loop of the piezoelectric transformer converter shown in FIG. 5. The frequency modulation circuit 24 changes the frequency from point A to point B such that the phase of the open loop characteristic becomes 0°. In this way, the output voltage is controlled by using the frequency characteristics of the power-use piezoelectric transformer 3. Here, the frequency modulation circuit 24 can easily achieve this end by changing the relation between phase and frequency through use of a known filter circuit composed of a resistor and a condenser.

Figure 7:
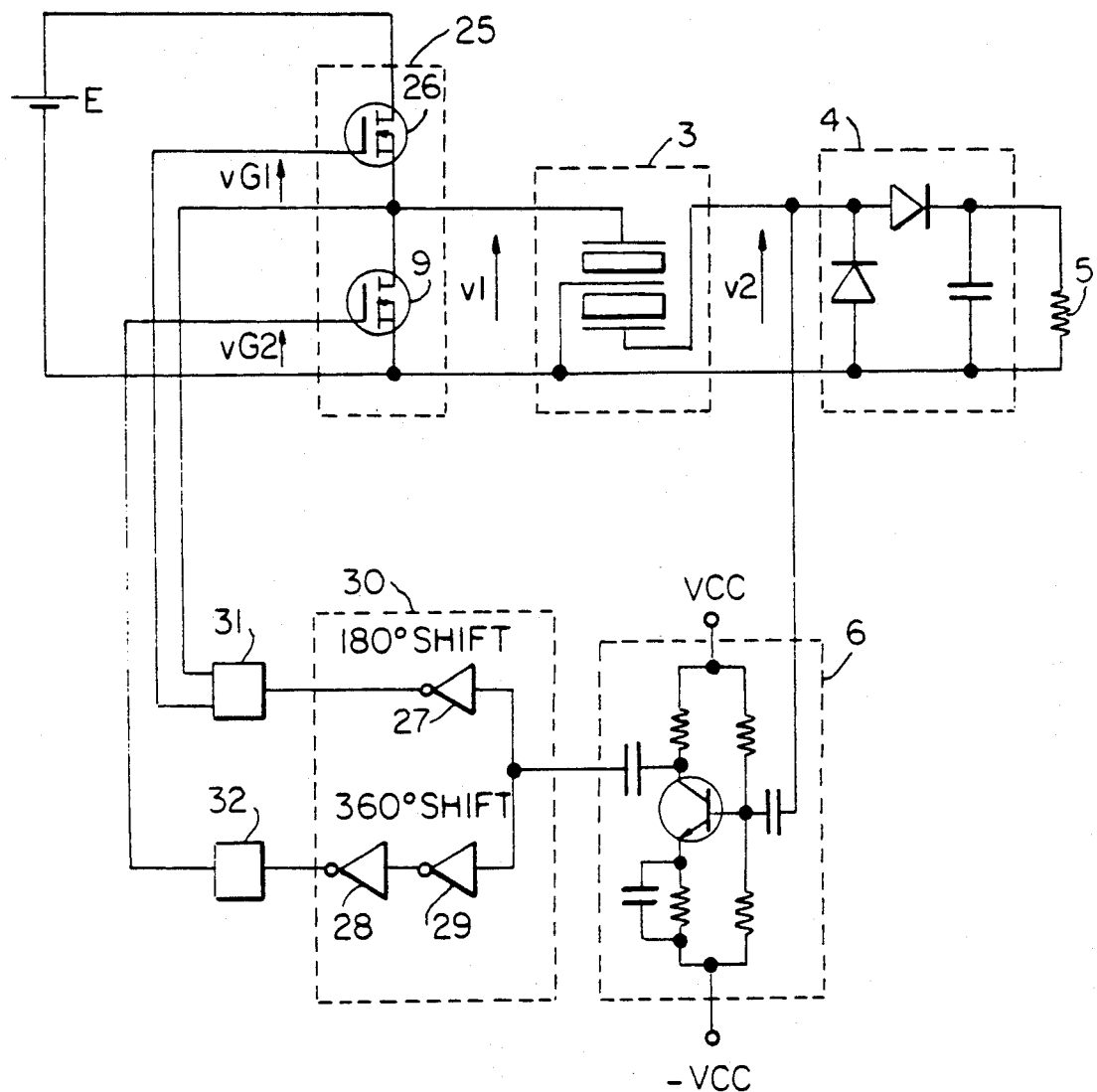
FIG. 7 is a circuit diagram showing the piezoelectric transformer converter for power use according to a fourth example of the present invention.

FIG. 7 shows a piezoelectric transformer converter for power use according to a fourth example of the present invention. The indicated piezoelectric transformer converter for power use is a circuit employing a rectangular-wave switching system, and instead of a switching circuit 2, uses a switching circuit 25 composed of two transistors 9 and 26, and instead of driving circuit 7, uses a circuit having a high voltage-resistant driving circuit 31, a low voltage-resistant driving circuit 32, and a waveform-shaping/phase-shift circuit 30 made up of three inverters 27, 28 and 29. In this example, for the purpose of realizing a rectangular wave, two transistors 9 and 26 alternately perform switching. As a result, the waveform-shaping/phase-shift circuit 30 waveform-shapes the alternating current output signal of the phase inversion-amplification circuit 6 as a clock, and furthermore shifts the phase by 180° and 360°. Using the signal phase-shifted 180°, the high voltage-resistant driving circuit 31 performs switching of transistor 26 of the switching circuit 25, and using the signal phase-shifted 360°, the low voltage-resistant driving circuit 32 performs switching of transistor 9 of the switching circuit 25.

Figure 8:
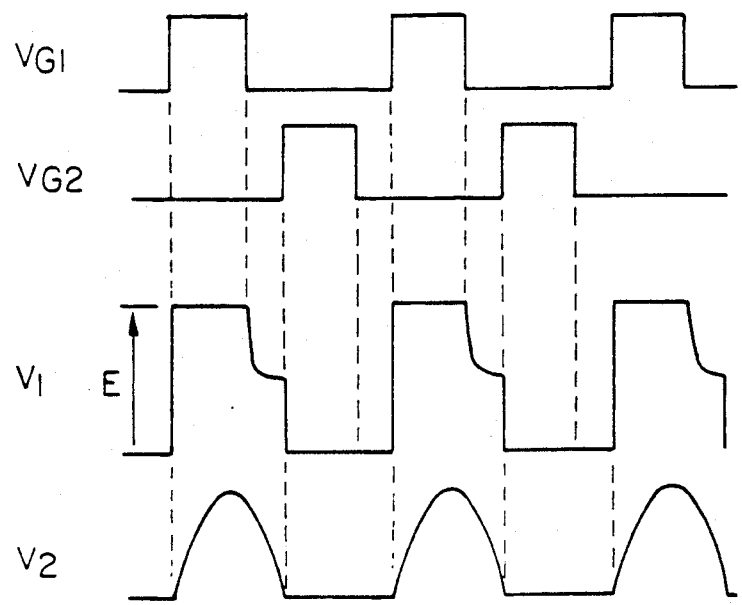
FIG. 8 is a wave form chart showing, in the piezoelectric transformer converter for power use shown in FIG. 7, the wave forms of the gate voltages $v_{G1}$ and $v_{G2}$ supplied to the gate of the transistor of the switching circuit and the wave forms of the input voltage $v_1$ and the output voltage $v_2$ of a piezoelectric transformer.

FIG. 8 shows, in the piezoelectric transformer converter for power use shown in FIG. 7, the wave forms of the gate voltages $v_{G1}$ and $v_{G2}$ supplied to the gates of transistors 26 and 9 of the switching circuit 25 and the wave forms of the input voltage $v_1$ and the output voltage $v_2$ of the piezoelectric transformer 3.

In addition, the control of the piezoelectric transformer converter for power use shown in FIG. 7 can in the same manner use both the PWM control system shown in FIG. 4 and the frequency modulation control system shown in FIG. 5.

The piezoelectric transformer converter for power use of the present invention as described above can operate by taking as a power source a power-use piezoelectric transformer in which self-excited oscillation is caused without the use of an additional electrode. Furthermore, because the output voltage can be controlled by PWM or frequency modulation, switching automatically operates in the vicinity of resonance frequency even when there is variance in the characteristics of the power-use piezoelectric transformer, and the output voltage can therefore be held constant.

Although certain preferred embodiments of the present invention have been shown and described in detail, it should be understood that various changes and modifications may be made therein without departing from the scope of the appended claims.

What is claimed is:

1. A piezoelectric transformer converter for power use comprising switching means that generates an alternating current signal by switching an inputted direct current voltage;

a power-use piezoelectric transformer that generates and transmits a piezoelectric vibration in accordance with said alternating current signal and then converts and outputs the voltage of said alternating current signal;

rectification-smoothing means that rectifies and smooths the alternating current output from the power-use piezoelectric transformer;

phase inversion-amplification means that inverts the phase of and amplifies said alternating current output of said power-use piezoelectric transformer; and driving means that generates a pulse signal that drive said switching means in accordance with the output signal from the phase inversion-amplification means.

2. The piezoelectric transformer converter for power use of claim 1 having error amplification means that detects the output voltage of said rectification-smoothing means and amplifies the voltage difference between the output voltage and a reference voltage and having pulse width modulation means that changes the duty cycle of said pulse signal outputted by said driving means in accordance with the output voltage of said error amplification means for controlling the alternating current output voltage of said switching means in accordance with said voltage difference and, as a result, holding the direct current output voltage of said rectification-smoothing means to be constant.

3. The piezoelectric transformer converter for power use of claim 1 having error amplification means that detects the output voltage from said rectification-smoothing means and amplifies the voltage difference between the output voltage and said reference voltage and having frequency modulation means that changes the frequency during self-excited oscillation by means of the output voltage of the error amplification means for controlling the output frequency of said switching means by inputting into the phase inversion-amplification means the alternating current output of the frequency modulation means and, as a result, holding the direct current output voltage of said rectification-smoothing means to be constant.

\* \* \* \* \*